(12) United States Patent
Huang et al.

(10) Patent No.: US 11,405,135 B2
(45) Date of Patent: Aug. 2, 2022

(54) DECODING METHOD AND DECODING APPARATUS

(71) Applicant: HUAWEI TECHNOLOGIES CO., LTD., Guangdong (CN)

(72) Inventors: Yuanda Huang, Dongguan (CN); Bin Xia, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/316,817

(22) Filed: May 11, 2021

(65) Prior Publication Data

US 2021/0266097 A1   Aug. 26, 2021

Related U.S. Application Data

(63) Continuation of application No. PCT/CN2019/114190, filed on Oct. 30, 2019.

(30) Foreign Application Priority Data

Nov. 12, 2018  (CN) .......................... 201811339564.2

(51) Int. Cl.
  *H04L 1/00*    (2006.01)
  *H03M 13/45*   (2006.01)

(52) U.S. Cl.
  CPC .......... *H04L 1/0045* (2013.01); *H03M 13/45* (2013.01)

(58) Field of Classification Search
  CPC ..... H04L 1/0045; H04L 1/005; H04L 1/0047; H04L 65/60; H03M 13/45;
  (Continued)

(56) References Cited

U.S. PATENT DOCUMENTS 8,930,791 B2   1/2015 Li et al.
10,091,046 B1  10/2018 Lefevre
(Continued)

FOREIGN PATENT DOCUMENTS

CA   2814578 A1   10/2013
CN   1494784 A    5/2004
(Continued)

OTHER PUBLICATIONS

Extended European Search Report issued in EP19885846.6, dated Nov. 3, 2021, 8 pages.
(Continued)

*Primary Examiner* — Thien Nguyen (57) ABSTRACT

A decoding method performed by a receive end device is disclosed. The decoding method includes: receiving a first bit signal; performing level-M forward error correction (FEC) decoding on the first bit signal to obtain a second bit signal, where M is a positive integer greater than zero; checking the second bit signal to obtain a first check result; performing level-(M+1) FEC decoding on the second bit signal based on the first check result to obtain a third bit signal; and, upon determining that M+1 reaches a first preset threshold, performing data processing on the third bit signal to obtain a fourth bit signal, where the fourth bit signal is used by the receive end device to obtain service data transmitted by a transmit end device.

19 Claims, 4 Drawing Sheets

(58) Field of Classification Search
CPC .......... H03M 13/3746; H03M 13/63; H03M 13/6325; H03M 13/1111; H03M 13/3905; H03M 13/4138; H04N 7/22
See application file for complete search history.

(56) References Cited

U.S. PATENT DOCUMENTS

| | | | |
|---|---|---|---|
| 2010/0131830 A1 | 5/2010 | Brown et al. | |
| 2014/0369680 A1 | 12/2014 | Oveis Gharan et al. | |
| 2015/0381315 A1* | 12/2015 | Thomson | H04L 1/0045 714/776 |
| 2017/0214415 A1* | 7/2017 | Kokubun | G06F 11/1068 |
| 2019/0089375 A1* | 3/2019 | Li | H03M 13/255 |
| 2020/0057693 A1* | 2/2020 | Kim | G06F 11/1012 |
| 2020/0313773 A1* | 10/2020 | Torbatian | H04L 27/3483 |

FOREIGN PATENT DOCUMENTS

| | | |
|---|---|---|
| CN | 102468919 A | 5/2012 |
| CN | 108092712 A | 5/2018 |
| CN | 108574650 A | 9/2018 |
| CN | 109964426 A | 7/2019 |
| KR | 20160029332 A | 3/2016 |
| WO | 2018001595 A1 | 1/2018 |
| WO | 2018077443 A1 | 5/2018 |

OTHER PUBLICATIONS

Fred Buchali et al., "Probabilistically Shaped QAM for Independent Reach, Spectral Efficiency and Bit-rate Adaptation", ECOC 2016, 42nd European Conference and Exhibition on Optical Communications, Sep. 18-22, 2016 Düusseldorf, 3 pages.

Georg Böcherer et al, "Optimal Quantization for Distribution Synthesis", IEEE Transactions on Information Theory, vol. 62, No. 11, Nov. 2016, 11 pages.

Office Action issued in CN 201811339564.2, dated Jun. 2, 2021, total 7 pages.

International Search Report and Written Opinion issued in PCT/2019/114190, dated Jan. 23, 2020, total 9 pages.

Xiang Liu et al.,"Generation and FEC-Decoding of a 231.5-GB/s PDM-OFDM Signal with 256-Iterative-Polar-Modulation Achieving 11.15-b/s/Hz Intrachannel Spectral Efficiency and 800-km Reach", total: 3pages.

Lu Yang et al.,"Design for Physical Layer Network Coding Based on Decode and-Forward Relay", May 29, 2015, with English Abstract total: 64 pages.

Office Action issued in CN201811339564.2, dated Nov. 17, 2021, 7 pages.

* cited by examiner

DECODING METHOD AND DECODING APPARATUS

CROSS-REFERENCE TO RELATED APPLICATIONS

This application is a continuation of International Application No. PCT/CN2019/114190, filed on Oct. 30, 2019, which claims priority to Chinese Patent Application No. 201811339564.2, filed on Nov. 12, 2018. The disclosures of the aforementioned applications are hereby incorporated by reference in their entireties.

TECHNICAL FIELD

This application relates to communications technologies, and in particular, to a decoding method and a decoding apparatus.

BACKGROUND

With the growing demand for the mobile Internet, 4K/8K video technologies and virtual reality (VR) video technologies are evolving, and therefore, an optical transmission network with a larger capacity needs to be provided to meet the growing user demand.

Currently, spectral efficiency and a transmission capability are improved using a probabilistic shaping/shaped quadrature amplitude modulation (PS-QAM) system. In the PS-QAM system, a transmit end converts a bit stream into an optical signal for transmission, and a receive end decodes the optical signal into a bit signal. The transmit end performs probabilistic shaping/shaped (PS) coding on the bit signal, where PS coding includes distribution matching (DM) coding and binary labeling (BL) mapping; then performs forward error correction (FEC) coding and quadrature amplitude modulation (QAM) mapping processing; and then forms an optical signal output through electrical-to-optical (E/O) conversion. The receive end converts the optical signal into a digital signal through optical-to-electrical (O/E) conversion, then performs QAM decoding and mapping on the digital signal to obtain a bit signal, and then performs FEC decoding and PS decoding to obtain the bit signal.

However, the receive end performs the FEC decoding process for the bit signal and the PS decoding process for the bit signal separately, and in actual application, PS decoding provides a capability of checking the bit signal. Therefore, in the PS-QAM system, there is no correlation between FEC decoding and PS decoding, resulting in poor FEC decoding performance and a poor system transmission capability.

SUMMARY

Embodiments of this application provide a decoding method, so as to improve FEC decoding performance and a system transmission capability.

A first aspect of the embodiments of this application provides a decoding method, including:

To improve spectral efficiency and a transmission capability, currently service data may be transmitted using an optical transmission communications system, a microwave communications system, or the like. A transmit end device transmits the service data in a form of a bit signal, then the receive end device receives a first bit signal transmitted by the transmit end device, and then the receive end device performs level-M FEC decoding on the first bit signal to obtain a second bit signal, where M is a positive integer greater than zero. After that, the receive end device may check the second bit signal to obtain a first check result, and perform level-(M+1) FEC decoding on the second bit signal based on the first check result to obtain a third bit signal; and when M+1 reaches a first preset threshold, the receive end device may perform data processing on the third bit signal to obtain a fourth bit signal, where the fourth bit signal is used by the receive end device to obtain the service data transmitted by the transmit end device.

In this embodiment, level-(M+1) FEC decoding may be performed based on the first check result of the second bit signal to obtain the third bit signal. In the prior art, the receive end device performs level-M FEC decoding on the first bit signal to obtain the second bit signal. The receive end device then continues to perform level-(M+1) decoding on the second bit signal to obtain the third bit signal, and does not check the second bit signal. Therefore, compared with the prior art, the technical solution of the present invention can improve accuracy of the third bit signal obtained through FEC decoding, thereby improving FEC decoding performance and the system transmission capability. When M+1 reaches the first preset threshold, the receive end device performs data processing on the third bit signal to obtain the fourth bit signal, where the fourth bit signal is used by the receive end device to obtain the service data transmitted by the transmit end device. In this way, accuracy of the obtained fourth bit signal is improved, so that the receive end device can correctly obtain the service data transmitted by the transmit end device.

In an example embodiment, that the receive end device checks the second bit signal to obtain the first check result may include: First, if the receive end device determines that a current count of each type of symbol in symbols corresponding to the second bit signal is equal to a preset count of the type of symbol, the receive end device may determine the first check result, where the first check result indicates that a check is successful, the current count of each type of symbol is a count of occurrences of the type of symbol in the symbols corresponding to the second bit signal, and the preset count of each type of symbol is a preset count of occurrences of the type of symbol in symbols corresponding to the first bit signal. That the receive end device performs level-(M+1) FEC decoding on the second bit signal based on the first check result to obtain the third bit signal may include: First, the receive end device may adjust a log-likelihood ratio (LLR) value currently corresponding to the second bit signal to obtain a first LLR value, where an absolute value of the first LLR value is greater than an absolute value of the LLR value currently corresponding to the second bit signal; and the receive end device may then perform level-(M+1) FEC decoding on the second bit signal based on the first LLR value to obtain the third bit signal. In this example embodiment, a specific check method and a specific FEC decoding process when a check is successful are provided. In actual application, feasibility and practicability of the solution are improved.

In another example embodiment, the absolute value of the first LLR value is an absolute value of a preset maximum LLR value corresponding to the second bit signal, or the absolute value of the first LLR value is K times the absolute value of the LLR value currently corresponding to the second bit signal, where K is an integer greater than 1. In this example embodiment, a specific absolute value of the first LLR value obtained through adjustment of the receive end device is provided, that is, two specific adjustment amplitude solutions are provided, thereby improving the feasibility and practicability of the solutions.

In another example embodiment, that the receive end device checks the second bit signal to obtain the first check result may include: If the receive end device determines that a current count of each type of symbol in symbols corresponding to the second bit signal is not equal to a preset count of the type of symbol, the receive end device may determine the first check result, where the first check result indicates that a check fails, the current count of each type of symbol is a count of occurrences of the type of symbol in the symbols corresponding to the second bit signal, and the preset count of each type of symbol is a preset count of occurrences of the type of symbol in symbols corresponding to the first bit signal. That the receive end device performs level-(M+1) FEC decoding on the second bit signal based on the first check result to obtain the third bit signal may include: First, the receive end device may adjust an LLR value currently corresponding to the second bit signal to obtain a second LLR value, where an absolute value of the second LLR value is less than an absolute value of the LLR value currently corresponding to the second bit signal; and then the receive end device may perform level-(M+1) FEC decoding on the second bit signal based on the second LLR value to obtain the third bit signal. In this example embodiment, a specific check method and a specific FEC decoding process when a check fails are provided. In actual application, feasibility and integrity of the solution are improved.

In another example embodiment, after the receive end device performs level-M FEC decoding on the first bit signal to obtain the second bit signal, and before the receive end device checks the second bit signal to obtain the first check result, the method may further include: The receive end device may determine the symbols corresponding to the second bit signal. In this embodiment, before checking the second bit signal, the receive end device may first determine the symbols corresponding to the second bit signal, and then check the second bit signal based on the symbols corresponding to the second bit signal.

In another example embodiment, that the receive end device determines the symbols corresponding to the second bit signal may include: The receive end device may perform BL demapping processing on the second bit signal to obtain the symbols corresponding to the second bit signal. In this example embodiment, a specific manner of determining the symbols corresponding to the second bit signal by the receive end device is provided, thereby improving feasibility of the solution.

In another example embodiment, after the receive end device performs level-M FEC decoding on the first bit signal to obtain the second bit signal, and before the receive end device checks the second bit signal to obtain the first check result, the method may further include: The receive end device may determine whether the LLR value currently corresponding to the second bit signal is greater than a second preset threshold; and if the LLR value is greater than the second preset threshold, the receive end device is triggered to check the second bit signal to obtain the first check result. In this embodiment, the LLR value currently corresponding to the second bit signal is first determined; and the check is performed only when the LLR value currently corresponding to the second bit signal is greater than the second preset threshold, so that efficiency and validity of the check can be improved.

In another example embodiment, when M+1 does not reach the first preset threshold, the method may include: First, the receive end device may check the third bit signal to obtain a second check result; and then, the receive end device may perform level-(M+2) FEC decoding on the third bit signal based on the second check result to obtain a fifth bit signal. In this embodiment, a technical solution is provided for the case when M+1 does not reach the first preset threshold, which improves integrity of the solution.

In another example embodiment, that the receive end device performs, when M+1 reaches the first preset threshold, data processing on the third bit signal to obtain the fourth bit signal may include: First, the receive end device performs BL demapping processing on the third bit signal to obtain symbols corresponding to the third bit signal; then the receive end device performs DM decoding on the symbols corresponding to the third bit signal to obtain the fourth bit signal; and then the receive end device outputs the fourth bit signal. In this example embodiment, a technical solution is provided for the case when M+1 reaches the first preset threshold, which improves feasibility and integrity of the solution.

A second aspect of the embodiments of this application provides a decoding apparatus, where the decoding apparatus has a function of implementing an action of the decoding apparatus according to the first aspect. The function may be implemented by hardware, or may be implemented by executing corresponding software by hardware. The hardware or software includes one or more modules corresponding to the foregoing function.

A third aspect of the embodiments of this application provides a decoding apparatus, where the decoding apparatus includes a processor, a memory, an input/output device, and a bus; the processor, the memory, and the input/output device are separately connected to the bus, and the memory store computer instructions; and when executing the computer instructions in the memory, the processor is configured to implement any one of the embodiments of the first aspect.

A fourth aspect of the embodiments of this application provides a chip system, where the chip system includes a processor, configured to support a network device in implementing functions in the first aspect, such as sending or processing data and/or information used in the foregoing method. In an example embodiment, the chip system further includes a memory, where the memory is configured to store necessary program instructions and data for the network device. The chip system may be formed by chips, or may include chips and other discrete devices.

A fifth aspect of the embodiments of this application provides a computer program product including instructions, where when the computer program product is run on a computer, the computer is enabled to perform any one of the implementations of the first aspect.

A sixth aspect of the embodiments of this application provides a computer-readable storage medium, where the storage medium stores instructions; and when the instructions are run on a computer, the computer is enabled to perform any one of the implementations of the first aspect.

It can be learned from the foregoing technical solution that the embodiments of this application have the following advantages:

According to the technical solution of this application, the receive end device receives the first bit signal, where the first bit signal is a bit signal transmitted by the transmit end within a preset duration, and the receive end device performs level-M forward error correction (FEC) decoding on the first bit signal to obtain the second bit signal, where M is a positive integer greater than zero; the receive end device checks the second bit signal to obtain the first check result; and then the receive end device may perform level-(M+1) FEC decoding on the second bit signal based on the first check result to obtain the third bit signal. According to the technical solution of this application, the receive end device checks the second bit signal obtained after level-M FEC decoding to obtain the first check result, and then performs level-(M+1) FEC decoding on the second bit signal based on the first check result to obtain the third bit signal; and when M+1 reaches the preset threshold, the receive end device may perform data processing on the third bit signal to obtain the fourth bit signal. Therefore, level-(M+1) FEC decoding may be performed based on the first check result of the second bit signal to obtain the third bit signal. In this way, the accuracy of the third bit signal obtained through FEC decoding can be improved, thereby improving FEC decoding performance and the system transmission capability. When M+1 reaches the first preset threshold, the receive end device performs data processing on the third bit signal to obtain the fourth bit signal, where the fourth bit signal is used by the receive end device to obtain service data transmitted by the transmit end device. In this way, the accuracy of the obtained fourth bit signal is improved, so that the receive end device can correctly obtain the service data transmitted by the transmit end device.

BRIEF DESCRIPTION OF DRAWINGS

FIG. 7 is another schematic structural diagram of a decoding apparatus according to an embodiment of this application.

DESCRIPTION OF EMBODIMENTS

Embodiments of this application provide a decoding method, so as to improve FEC decoding performance and a system transmission capability.

Figure 1:
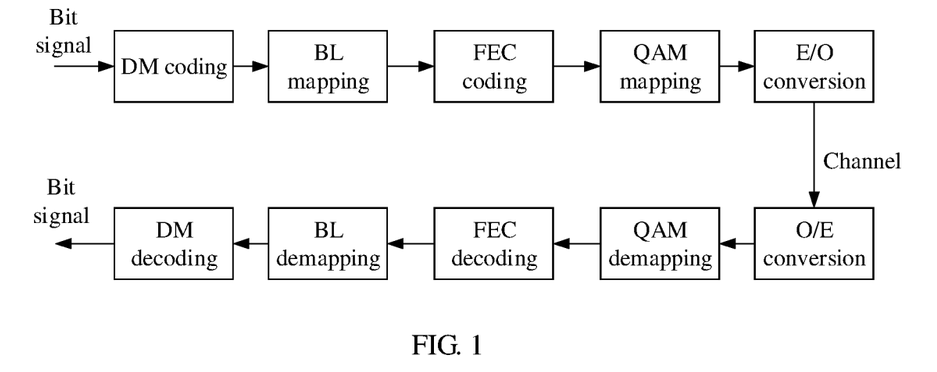
FIG. 1 is a schematic diagram of an application scenario of a system according to an embodiment of this application.

FIG. 1 is a schematic framework diagram of an application scenario of a system according to an embodiment of this application. FIG. 1 shows a PS-QAM system. When an optical terminal multiplexer (OTM) data service or an Ethernet data service is provided for a user, data carried by the OTM data service first passes through the PS-QAM system, and a transmit end device transmits the service data in a form of a bit signal, where the OTM data service may be a video service, an audio service, an image service, or the like. This is not specifically limited in embodiments of this application. First, the transmit end device encodes the bit signal through probabilistic shaping/shaped PS coding, where PS coding includes distribution matching (DM) coding and BL mapping, then performs FEC decoding on the bit signal, performs QAM mapping on the bit signal, and then converts the bit signal into an optical signal through E/O conversion, thereby implementing transmission of the optical signal over a fiber channel A receive end device receives the optical signal, converts the optical signal into a bit signal through O/E conversion, and then performs QAM demapping, FEC decoding and PS decoding on the bit signal to obtain the bit signal, so that the receive end device obtains the decoded bit signal, thereby implementing transmission of the data carried by the data service. However, in the PS-QAM system, because the receive end device performs FEC decoding on the bit signal and PS decoding on the bit signal separately, and in actual application, PS decoding provides a capability of checking the bit signal. Therefore, in the PS-QAM system, there is no correlation between FEC decoding and PS decoding, resulting in poor FEC decoding performance and a poor system transmission capability.

It should be noted that FIG. 1 is only a schematic diagram of a system scenario used to describe the decoding method of this application. In actual application, the decoding method of this application is also applicable to another type of system, such as a microwave communications system or a mobile communications system. This is not specifically limited in embodiments of this application.

In view of this, an embodiment of this application provides a decoding method, so as to improve FEC decoding performance and a system transmission capability. A receive end device receives a first bit signal, where the first bit signal is a bit signal transmitted by a transmit end within a preset duration, and the receive end device performs level-M forward error correction (FEC) decoding on the first bit signal to obtain a second bit signal, where M is a positive integer greater than zero; the receive end device checks the second bit signal to obtain a first check result; and then the receive end device may perform level-(M+1) FEC decoding on the second bit signal based on the first check result to obtain a third bit signal. According to the technical solution of this application, the receive end device checks the second bit signal obtained after level-M FEC decoding to obtain the first check result, and then performs level-(M+1) FEC decoding on the second bit signal based on the first check result to obtain the third bit signal; and when M+1 reaches a preset threshold, the receive end device may perform data processing on the third bit signal to obtain a fourth bit signal. Therefore, level-(M+1) FEC decoding may be performed based on the first check result of the second bit signal to obtain the third bit signal. In the prior art, the receive end device performs level-M FEC decoding on the first bit signal to obtain the second bit signal. The receive end device then continues to perform level-(M+1) decoding on the second bit signal to obtain the third bit signal, and does not check the second bit signal. Therefore, compared with the prior art, the technical solution of the present invention can improve accuracy of the third bit signal obtained through FEC decoding, thereby improving FEC decoding performance and a system transmission capability. When M+1 reaches the preset threshold, the receive end device performs data processing on the third bit signal to obtain the fourth bit signal, where the fourth bit signal is used by the receive end device to obtain the service data transmitted by the transmit end device. In this way, accuracy of the obtained fourth bit signal is improved, so that the receive end device can correctly obtain the service data transmitted by the transmit end device.

In this embodiment of this application, the receive end device may perform FEC decoding on the bit signal in two manners: Manner 1: The receive end device performs FEC decoding on an LLR value currently corresponding to the bit signal, then obtains a decoded LLR value corresponding to the bit signal, and then determines the bit signal by using the corresponding LLR value; Manner 2: The receive end device performs FEC decoding on the bit signal to obtain a decoded bit signal. In this embodiment, the receive end device may select, based on an actual situation, a corresponding manner of performing FEC decoding on the bit signal. This is not specifically limited in embodiments of this application. In a subsequent embodiment, only an example in which the receive end device performs FEC decoding using Manner 1 is described.

In this embodiment of this application, that the receive end device checks the second bit signal to obtain the first check result may be as follows: The receive end device checks the second bit signal based on a count of each type of symbol in symbols corresponding to the second bit signal and a preset count of each type of symbol to obtain the first check result. The receive end device can also check the second bit signal in another manner. This is not specifically limited in embodiments of this application. In a subsequent embodiment, only an example in which the receive end device checks the second bit signal based on the count of each type of symbol in the symbols corresponding to the second bit signal and the preset count of each type of symbol to obtain the first check result is described.

Figure 2A:
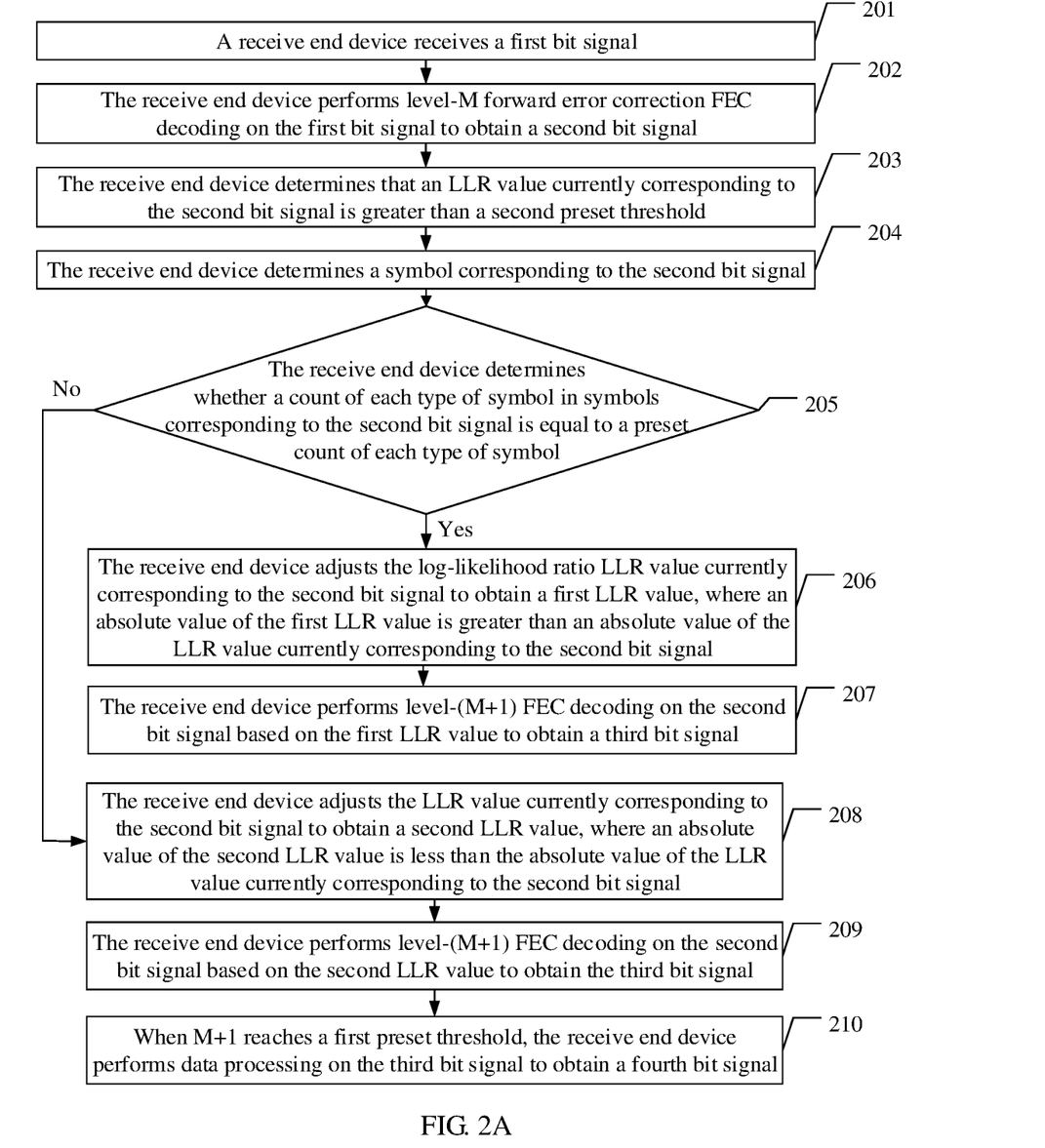
FIG. 2A is a schematic diagram of an embodiment of a decoding method according to an embodiment of this application.

The decoding method in the embodiments of this application is described below from the perspective of a receive end device. Referring to FIG. 2A, an embodiment of the decoding method in the embodiments of this application includes:

201. A receive end device receives a first bit signal.

To improve spectral efficiency and a transmission capability, currently a bit signal may be transmitted using an optical transmission communications system, a microwave communications system, or the like. The optical transmission communications system is used as an example for description. In an optical transmission network, a bit signal is converted into an optical signal, so as to implement transmission of the optical signal through an optical fiber, and then the optical signal is converted into the bit signal by the receive end device. A PS-QAM system is used as an example for description. The transmit end device encodes a bit signal transmitted within a preset duration through probabilistic shaping/shaped PS coding to obtain a bit signal, where PS coding includes distribution matching (DM) coding and BL mapping, then performs FEC decoding on the bit signal, and then converts the bit signal into an optical signal through QAM mapping and E/O conversion, thereby realizing transmission of the optical signal over a fiber channel. When the receive end device receives the optical signal and obtains the first bit signal through O/E conversion and QAM demapping, the receive end device can obtain the first bit signal, where the first bit signal is the bit signal transmitted by the transmit end device within the preset duration. It should be noted that a preset count of occurrences of each type of symbol in symbols corresponding to the bit signal transmitted within the preset duration is preset by the transmit end device. For example, it is assumed that symbols corresponding to the first bit signal are "1" and "3", and a preset count of occurrences of "1" is 1, and a preset count of occurrences of "3" is 2.

202. The receive end device performs level-M FEC decoding on the first bit signal to obtain a second bit signal.

The receive end device may perform level-M FEC decoding on the first bit signal to obtain the second bit signal. Specifically, the receive end device receives an LLR value currently corresponding to the first bit signal and obtained through QAM demapping; that is, the receive end device performs level-M FEC decoding based on the LLR value currently corresponding to the first bit signal to obtain a decoded LLR value corresponding to the first bit signal. Specifically, that the receive end device performs level-M FEC decoding based on the LLR value currently corresponding to the first bit signal may be as follows: The receive end device uses the LLR value currently corresponding to the first bit signal as a variable, and obtains, through calculation based on a preset algorithm, the decoded LLR value corresponding to the first bit signal, that is, an LLR value of the second bit signal. The preset algorithm may be a belief propagation algorithm, a soft output Viterbi algorithm, or a Bahl-Cocke-Jelinek-Raviv (BCJR) algorithm (designed by Bahl, Cocke, Jelinek, and Raviv). This is not specifically limited in embodiments of the present disclosure.

203. The receive end device determines that an LLR value currently corresponding to the second bit signal is greater than a second preset threshold.

The receive end device may determine the LLR value currently corresponding to the second bit signal, and then determine whether the LLR value is greater than the second preset threshold. If the LLR value is greater than the second preset threshold, step 204 is performed; or if the LLR value currently corresponding to the second bit signal is not greater than the second preset threshold, the receive end device continues to perform level-(M+1) decoding on the second bit signal, that is, the receive end device first performs level-(M+1) FEC decoding directly without performing a check.

In step 203, the receive end device determines whether the LLR value currently corresponding to the second bit signal is greater than the second preset threshold, and checks the second bit signal only when the LLR value currently corresponding to the second bit signal is greater than the second preset threshold, so that check efficiency can be improved and FEC decoding performance can be effectively improved. When the LLR value currently corresponding to the second bit signal does not reach the second preset threshold, it is not significant to perform the check. Therefore, when the LLR value is not greater than the second preset threshold, iterative FEC decoding needs to be performed on the second bit signal first. It should be noted that step 203 is an optional step. In this embodiment, the step may not be performed, but the second bit signal is directly checked. This is not specifically limited in embodiments of this application.

204. The receive end device determines symbols corresponding to the second bit signal.

The receive end device determines the second bit signal based on the LLR value corresponding to the second bit signal, and then determines the symbols corresponding to the second bit signal. Specifically, the receive end device may obtain the symbols corresponding to the second bit signal through BL demapping. Example 1: LLR values corresponding to second bit signals are 1.38, 0.4, 2.2, −2.2, and −1.38, respectively. The receive end device then can determine that the second bit signals are 1, 1, 1, 0, and 0, respectively. In this case, bit "1" is mapped to symbol "1" and bit "0" is mapped to symbol "3". It can then be learned that the symbols corresponding to the second bit signals are 1, 1, 1, 3, and 3. Example 2: The LLR values corresponding to the second bit signals are 1.38, 0.4, 2.2, −2.2, −1.38, 0.5, 2, −1.38, −0.5, and −1, respectively. In this case, the receive end device can determine that the second bit signals are 1, 1, 1, 0, 0, 1, 1, 0, 0, and 0. In this case, bits "00" are mapped to symbol "1", bits "01" are mapped to symbol "3", bits "10" are mapped to symbol "5", and bits "11" are mapped to symbol "7". It can then be learned that the symbols corresponding to the second bit signal are 7, 5, 3, 5, and 1.

Figure 2B:
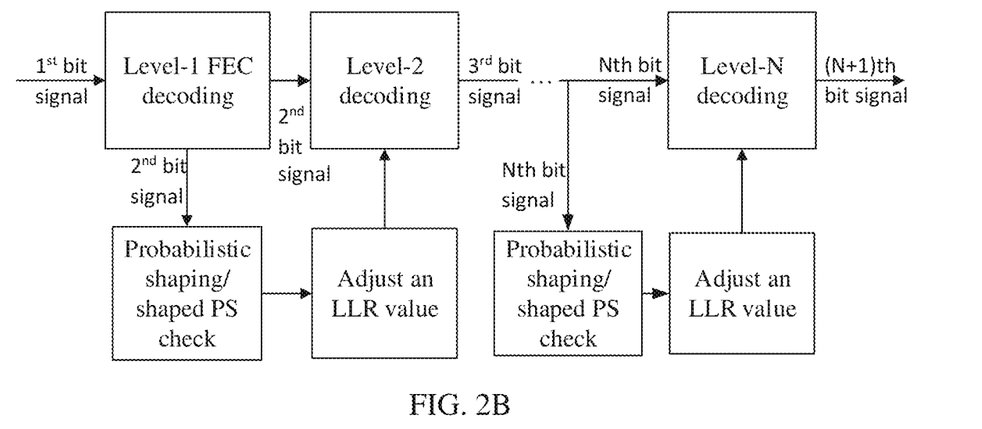
FIG. 2B is a schematic diagram of a scenario of a decoding method according to an embodiment of this application.

It should be noted that, it can be learned from Example 1 that when bit "0" and bit "1" mapped to symbols are one-to-one mapped to symbols, the receive end device may not perform step 204. In this case, because bit "0" and bit "1" each represents one type of symbol, the count of each type of symbol can be determined based on the second bit signal. A specific block diagram may be shown in FIG. 2B; that is, the receive end device may directly check the second bit signal and adjust the LLR value currently corresponding to the second bit signal without performing BL demapping on the second bit signal.

205. The receive end device determines whether a count of each type of symbol in the symbols corresponding to the second bit signal is equal to a preset count of the type of symbol; and if the count of each type of symbol in the symbols corresponding to the second bit signal is equal to the preset count of the type of symbol, performs step 206; or if the count of each type of symbol in the symbols corresponding to the second bit signal is not equal to the preset count of the type of symbol, performs step 208.

The receive end device may determine whether the count of each type of symbol in the symbols corresponding to the second bit signal is equal to the preset count of the type of symbol. If the count of each type of symbol in the symbols corresponding to the second bit signal is equal to the preset count of the type of symbol, step 206 is performed; or if the count of each type of symbol in the symbols corresponding to the second bit signal is not equal to the preset count of the type of symbol, step 208 is performed. For example, in Example 1 in step 204, the symbols corresponding to the second bit signal are 1, 1, 1, 3, and 3. It is assumed that the bit signal transmitted within the preset duration includes a total of 5 symbols, and in the symbols corresponding to the first bit signal from the transmit end device, a preset count of occurrences of symbol "1" is 3, and a preset count of occurrences of symbol "3" is 2. The receive end device can then determine that the count of each type of symbol is equal to the preset count of the type of symbol. Also as shown in Example 2 in step 204, it is assumed that the first bit signal from the transmit end device includes a total of 5 symbols, and in the symbols corresponding to the first bit signal from the transmit end device, the preset count of occurrences of symbol "1" is 2, the preset count of occurrences of symbol "3" is 1, the preset count of occurrences of symbol "5" is 1, and the preset count of occurrences of symbol "7" is 1. It can then be learned, based on the symbols 7, 5, 3, 5, and 1 corresponding to the second bit signal of the transmit end device, that the count of each type of symbol in the second bit signal is not equal to the preset count of the type of symbol.

206. The receive end device adjusts the log-likelihood ratio (LLR) value currently corresponding to the second bit signal to obtain a first LLR value, where an absolute value of the first LLR value is greater than an absolute value of the LLR value currently corresponding to the second bit signal.

If the receive end device determines that the count of each type of symbol in the symbols corresponding to the second bit signal is equal to the preset count of the type of symbol, the receive end device adjusts the LLR value currently corresponding to the second bit signal to obtain the first LLR value, where the absolute value of the first LLR value is greater than the absolute value of the LLR value currently corresponding to the second bit signal. Specifically, the receive end device may increase the LLR value currently corresponding to the second bit signal to K times of the current LLR value, or may increase the LLR value currently corresponding to the second bit signal to a preset maximum LLR value corresponding to the second bit signal, that is, the absolute value of the first LLR value is K times of the absolute value of the current LLR value, or the absolute value of the first LLR value is the preset maximum LLR value corresponding to the second bit signal; or may adjust the LLR value currently corresponding to the second bit signal according to other rules. This is not specifically limited in embodiments of this application.

207. The receive end device performs level-(M+1) FEC decoding on the second bit signal based on the first LLR value to obtain a third bit signal.

The receive end device adjusts the LLR value corresponding to the second bit signal to obtain the first LLR value, and then the receive end device can perform level-(M+1) decoding on the second bit signal based on the first LLR value to obtain the third bit signal. Specifically, the receive end device uses the first LLR value as a variable, and obtains a decoded LLR value corresponding to the second bit signal by performing level-(M+1) FEC decoding based on a preset algorithm. The decoded LLR value corresponding to the second bit signal corresponds to the third bit signal.

208. The receive end device adjusts the LLR value currently corresponding to the second bit signal to obtain a second LLR value, where an absolute value of the second LLR value is less than the absolute value of the LLR value currently corresponding to the second bit signal.

If the receive end device determines that the count of each type of symbol in the symbols corresponding to the second bit signal is not equal to the preset count of the type of symbol, the receive end device decreases the LLR value currently corresponding to the second bit signal to obtain the second LLR value, where the absolute value of the second LLR value is less than the absolute value of the LLR value currently corresponding to the second bit signal. As shown in Example 2 described in step 205, if it is determined that the count of each type of symbol is not equal to the preset count of the type of symbol, the LLR value corresponding to the second bit signal is reduced. Specifically, decreasing the LLR value currently corresponding to the second bit signal by the receive end device may comprises decreasing the LLR value currently corresponding to the second bit signal to 1/K of the current LLR value, where K is an integer greater than 1, that is, the second LLR value is 1/K of the LLR value currently corresponding to the second bit signal. The receive end device may alternatively decrease the LLR value currently corresponding to the second bit signal to a preset minimum LLR value, for example, decrease the LLR value currently corresponding to the second bit signal to zero. This is not specifically limited in embodiments of this application.

209. The receive end device performs level-(M+1) FEC decoding on the second bit signal based on the second LLR value to obtain the third bit signal.

Step 209 is similar to step 207. Details are not repeated herein.

210. When M+1 reaches a first preset threshold, the receive end device performs data processing on the third bit signal to obtain a fourth bit signal.

Figure 3:
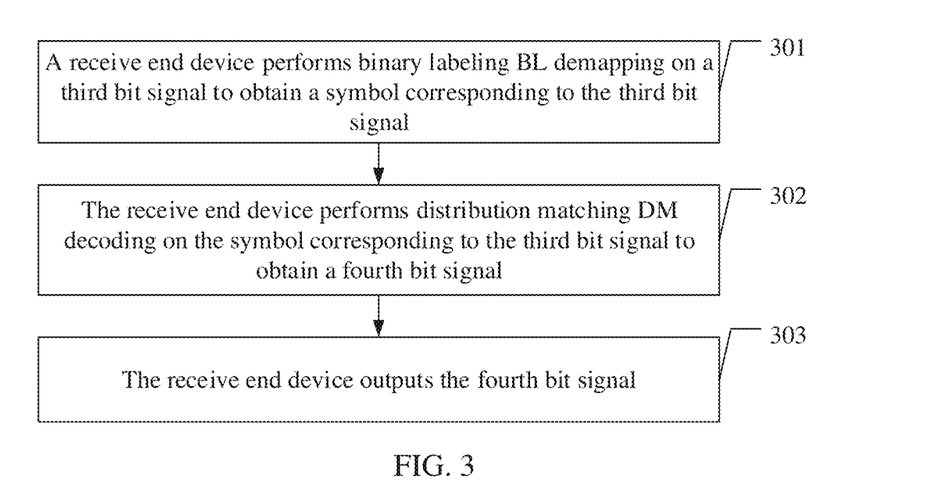
FIG. 3 is a schematic diagram of another embodiment of a decoding method according to an embodiment of this application.

The receive end device performs level-(M+1) decoding on the second bit signal to obtain the third bit signal. When M+1 reaches the first preset threshold, for example, when level-(M+1) decoding is FEC decoding of the last level, the receive end device may perform data processing on the third bit signal to obtain the fourth bit signal, where the fourth bit signal is a bit signal that is transmitted by the transmit end device and that is obtained through decoding by the receive end device, and is used by the receive end device to obtain service data transmitted by the transmit end device. FIG. 3 shows a process in which the receive end device performs data processing on the third bit signal. An example process includes:

301. The receive end device performs BL demapping on the third bit signal to obtain symbols corresponding to the third bit signal.

The receive end device performs BL demapping on the third bit signal. For example, it is assumed that the third bit signal is "1, 1, 1, 0, 0", bit "1" is mapped to symbol "1", and bit "0" is mapped to symbol "3". It can then be learned that symbols corresponding to the third bit signal are 1, 1, 1, 3, and 3.

302. The receive end device performs DM decoding on the symbols corresponding to the third bit signal to obtain a fourth bit signal.

The receive end device may perform DM decoding on the symbols corresponding to the third bit signal to obtain the fourth bit signal. For example, it is assumed that the symbols corresponding to the third bit signal are 1, 1, 1, 3, and 3. In the 5 symbols of the transmit end device, a count of occurrences of symbol "1" is 3, and a count of occurrences of symbol "3" is 2. Therefore, there are ten possible permutations and combinations. The transmit end device may then use three bits to represent eight possible permutations, for example, use bits "000" to correspond to symbols "1, 1, 1, 3, 3", and use bits "001" to correspond to symbols "1, 1, 3, 1, 3". Accordingly, when performing DM decoding on symbols "1, 1, 1, 3, 3", the receive end device can determine that a corresponding bit signal is "000", that is, the fourth bit signal is "000".

303. The receive end device outputs the fourth bit signal.

The receive end device outputs the fourth bit signal, so that conversion of an optical signal into a bit signal is implemented, and the receive end device can obtain the fourth bit signal. It can be learned from the example described in step 302 that the fourth bit signal is "000". Therefore, the receive end device obtains the output fourth bit signal by converting the optical signal into a bit signal and decoding the bit signal.

Figure 4:
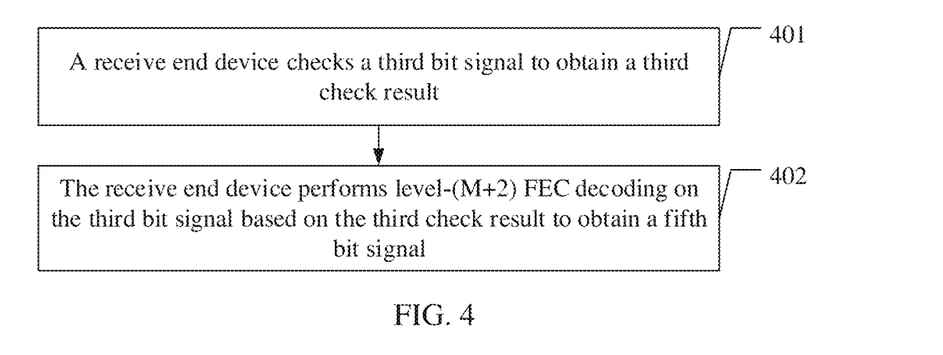
FIG. 4 is a schematic diagram of another embodiment of a decoding method according to an embodiment of this application.

When M+1 does not reach the first preset threshold, for example, when level-(M+1) decoding is not FEC decoding of the last level, the receive end device may continue to check the third bit signal, perform level-(M+2) decoding on the third bit signal, and the like. As shown in FIG. 4, an example process includes:

401. The receive end device checks the third bit signal to obtain a third check result.

The receive end device may continue to check the third bit signal, and a specific check manner is similar to that in step 205 in FIG. 2A. The check result is determined by comparing the count of each type of symbol in the symbols corresponding to the third bit signal with the preset count of the type of symbol. Details are not repeated herein.

402. The receive end device performs level-(M+2) FEC decoding on the third bit signal based on the third check result to obtain a fifth bit signal.

The receive end device may perform level-(M+2) decoding on the third bit signal based on the third check result to obtain the fifth bit signal. For a process of performing level-(M+2) decoding on the third bit signal based on the third check result, reference may be made to step 206 to step 209 in FIG. 2A. Details are not repeated herein.

Figure 5:
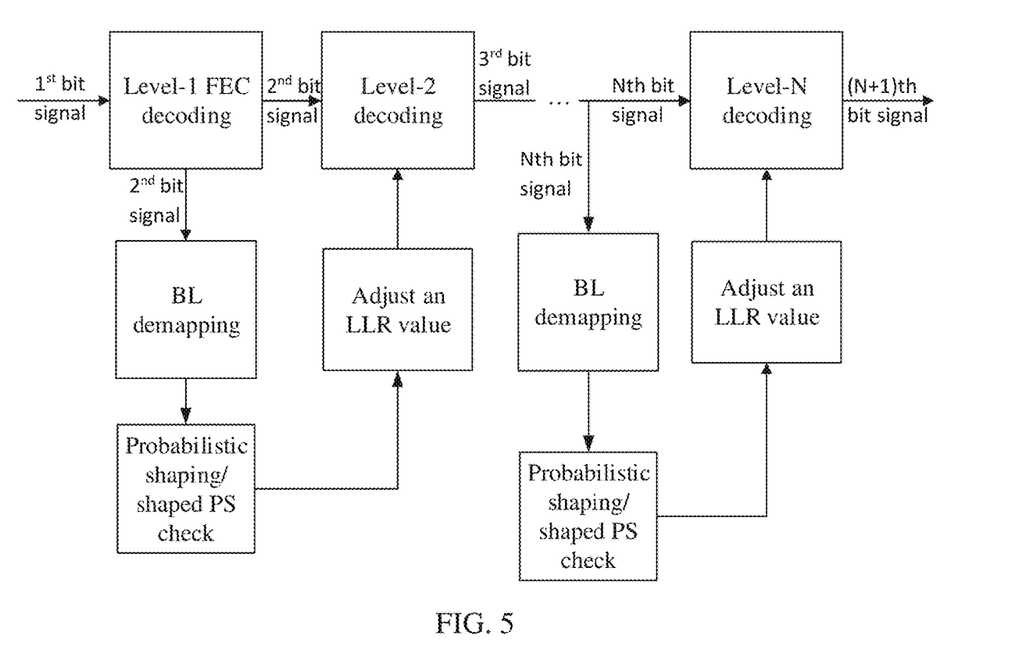
FIG. 5 is a schematic diagram of another scenario of a decoding method according to an embodiment of this application.

It should be noted that, after level-(M+1) decoding is performed, a check is performed, and then level-(M+2) decoding is performed. FIG. 5 is a schematic diagram of implementation of level-(M+2) decoding on the bit signal by the receive end device. The receive end device performs N levels of FEC decoding on the first bit signal. The receive end device then performs a check and decoding according to step 401 and step 402 until level-N FEC decoding is completed.

In this embodiment, the receive end device receives the first bit signal, where the first bit signal is a bit signal transmitted by the transmit end within the preset duration; and the receive end device performs level-M forward error correction (FEC) decoding on the first bit signal to obtain the second bit signal, where M is a positive integer greater than zero. The receive end device checks the second bit signal to obtain the first check result. The receive end device may then perform level-(M+1) FEC decoding on the second bit signal based on the first check result to obtain the third bit signal. According to the technical solution of this application, the receive end device checks the second bit signal obtained after level-M FEC decoding to obtain the first check result, and then performs level-(M+1) FEC decoding on the second bit signal based on the first check result to obtain the third bit signal. Therefore, level-(M+1) FEC decoding may be performed based on the first check result of the second bit signal to obtain the third bit signal. In this way, the accuracy of the third bit signal obtained through FEC decoding can be improved, thereby improving FEC decoding performance and the system transmission capability. When M+1 reaches the first preset threshold, the receive end device performs data processing on the third bit signal to obtain the fourth bit signal, where the fourth bit signal is used by the receive end device to obtain the service data transmitted by the transmit end device. In this way, the accuracy of the obtained fourth bit signal is improved, so that the receive end device can correctly obtain the service data transmitted by the transmit end device.

Figure 6:
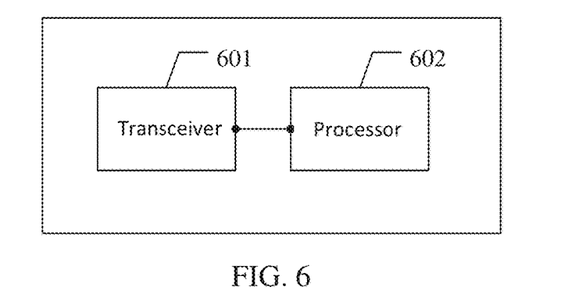
FIG. 6 is a schematic structural diagram of a decoding apparatus according to an embodiment of this application.

The decoding method in the embodiments of this application has been described above. A decoding apparatus in the embodiments of this application is described below. Referring to FIG. 6, an embodiment of the decoding apparatus in the embodiments of this application includes:

a transceiver 601, configured to receive a first bit signal;

a processor 602, configured to: perform level-M forward error correction (FEC) decoding on the first bit signal to obtain a second bit signal, where M is a positive integer greater than zero; check the second bit signal to obtain a first check result; perform level-(M+1) FEC decoding on the second bit signal based on the first check result to obtain a third bit signal; and when M+1 reaches a first preset threshold, perform data processing on the third bit signal to obtain a fourth bit signal, where the fourth bit signal is used by a receive end device to obtain service data transmitted by a transmit end device.

In this embodiment, the processor 602 is further configured to:

if the receive end device determines that a current count of each type of symbol in symbols corresponding to the second bit signal is equal to a preset count of the type of symbol, determine the first check result, where the first check result indicates that a check is successful, the current count of each type of symbol is a count of occurrences of the type of symbol in the symbols corresponding to the second bit signal, and the preset count of each type of symbol is a preset count of occurrences of the type of symbol in symbols corresponding to the first bit signal;

adjust a log-likelihood ratio (LLR) value currently corresponding to the second bit signal to obtain a first LLR value, where an absolute value of the first LLR value is greater than an absolute value of the LLR value currently corresponding to the second bit signal; and perform level-(M+1) FEC decoding on the second bit signal based on the first LLR value to obtain the third bit signal.

In this embodiment, the absolute value of the first LLR value is an absolute value of a preset maximum LLR value corresponding to the second bit signal, or the absolute value of the first LLR value is K times the absolute value of the LLR value currently corresponding to the second bit signal, where K is an integer greater than 1.

In this embodiment, the processor 602 is further configured to:

if the receive end device determines that a current count of each type of symbol in symbols corresponding to the second bit signal is not equal to a preset count of the type of symbol, determine the first check result, where the first check result indicates that a check fails, the current count of each type of symbol is a count of occurrences of the type of symbol in the symbols corresponding to the second bit signal, and the preset count of each type of symbol is a preset count of occurrences of the type of symbol in symbols corresponding to the first bit signal;

adjust a log-likelihood ratio (LLR) value currently corresponding to the second bit signal to obtain a second LLR value, where an absolute value of the second LLR value is less than an absolute value of the LLR value currently corresponding to the second bit signal; and perform level-(M+1) FEC decoding on the second bit signal based on the second LLR value to obtain the third bit signal.

In this embodiment, the processor 602 is further configured to:

determine the symbols corresponding to the second bit signal.

In this embodiment, the processor 602 is further configured to:

perform binary labeling (BL) demapping processing on the second bit signal to obtain the symbols corresponding to the second bit signal.

In this embodiment, the processor 602 is further configured to:

determine whether the LLR value currently corresponding to the second bit signal is greater than a second preset threshold; and if the LLR value currently corresponding to the second bit signal is greater than the second preset threshold, trigger the step of checking, by the processor 602, the second bit signal to obtain the first check result.

In this embodiment, when M+1 does not reach the first preset threshold, the processor 602 is further configured to:

check the third bit signal to obtain a second check result; and perform level-(M+2) FEC decoding on the third bit signal based on the second check result to obtain a fifth bit signal.

In this embodiment, when M+1 reaches the first preset threshold, the processor 602 is further configured to:

perform BL demapping processing on the third bit signal to obtain symbols corresponding to the third bit signal; and perform DM decoding on the symbols corresponding to the third bit signal to obtain the fourth bit signal.

The transceiver 601 is further configured to:
output the fourth bit signal.

In this embodiment, the transceiver 601 receives the first bit signal, and the processor 602 performs level-M forward error correction (FEC) decoding on the first bit signal to obtain the second bit signal, where M is a positive integer greater than zero; the processor 602 checks the second bit signal to obtain the first check result; and then the processor 602 may perform level-(M+1) FEC decoding on the second bit signal based on the first check result to obtain the third bit signal. According to the embodiment, the processor 602 checks the second bit signal obtained after level-M FEC decoding to obtain the first check result, and then the processor 602 performs level-(M+1) FEC decoding on the second bit signal based on the first check result to obtain the third bit signal. Therefore, the processor 602 may perform level-(M+1) FEC decoding based on the first check result of the second bit signal to obtain the third bit signal, so that the accuracy of the third bit signal obtained through FEC decoding can be improved, thereby improving FEC decoding performance and the system transmission capability. When M+1 reaches the first preset threshold, the processor 602 performs data processing on the third bit signal to obtain the fourth bit signal, where the fourth bit signal is used by the receive end device to obtain the service data transmitted by the transmit end device. In this way, the accuracy of the obtained fourth bit signal is improved, so that the receive end device can correctly obtain the service data transmitted by the transmit end device.

This application further provides a decoding apparatus 700. Referring to FIG. 7, an embodiment of the decoding apparatus includes:

a processor 701, a memory 702, an input/output device 703, and a bus 704.

The processor 701, the memory 702, and the input/output device 703 are separately connected to the bus 704, and the memory 702 stores computer instructions.

The input/output device 703 is configured to receive a first bit signal.

The processor 701 is configured to: perform level-M forward error correction (FEC) decoding on the first bit signal to obtain a second bit signal, where M is a positive integer greater than zero; check the second bit signal to obtain a first check result; perform level-(M+1) FEC decoding on the second bit signal based on the first check result to obtain a third bit signal; and when M+1 reaches a first preset threshold, perform data processing on the third bit signal to obtain a fourth bit signal, where the fourth bit signal is used by a receive end device to obtain service data transmitted by a transmit end device.

In an example embodiment, the processor 701 is further configured to:

if the receive end device determines that a current count of each type of symbol in symbols corresponding to the second bit signal is equal to a preset count of the type of symbol, determine the first check result, where the first check result indicates that a check is successful, the current count of each type of symbol is a count of occurrences of the type of symbol in the symbols corresponding to the second bit signal, and the preset count of each type of symbol is a preset count of occurrences of the type of symbol in symbols corresponding to the first bit signal;

adjust a log-likelihood ratio (LLR) value currently corresponding to the second bit signal to obtain a first LLR value, where an absolute value of the first LLR value is greater than an absolute value of the LLR value currently corresponding to the second bit signal; and perform level-(M+1) FEC decoding on the second bit signal based on the first LLR value to obtain the third bit signal.

In another example embodiment, the absolute value of the first LLR value is an absolute value of a preset maximum LLR value corresponding to the second bit signal, or the absolute value of the first LLR value is K times the absolute value of the LLR value currently corresponding to the second bit signal, where K is an integer greater than 1.

In another example embodiment, the processor 701 is further configured to:

if the receive end device determines that a current count of each type of symbol in symbols corresponding to the second bit signal is not equal to a preset count of the type of symbol, determine the first check result, where the first check result indicates that a check fails, the current count of each type of symbol is a count of occurrences of the type of symbol in the symbols corresponding to the second bit signal, and the preset count of each type of symbol is a preset count of occurrences of the type of symbol in symbols corresponding to the first bit signal;

adjust a log-likelihood ratio (LLR) value currently corresponding to the second bit signal to obtain a second LLR value, where an absolute value of the second LLR value is less than an absolute value of the LLR value currently corresponding to the second bit signal; and perform level-(M+1) FEC decoding on the second bit signal based on the second LLR value to obtain the third bit signal.

In another example embodiment, the processor 701 is further configured to:

determine the symbols corresponding to the second bit signal.

In another example embodiment, the processor 701 is further configured to:

perform binary labeling (BL) demapping processing on the second bit signal to obtain the symbols corresponding to the second bit signal.

In another example embodiment, the processor 701 is further configured to:

determine whether the LLR value currently corresponding to the second bit signal is greater than a second preset threshold; and if the LLR value currently corresponding to the second bit signal is greater than the second preset threshold, trigger the step of checking, by the processor 701, the second bit signal to obtain the first check result.

In another example embodiment, when M+1 does not reach the first preset threshold, the processor 701 is further configured to:

check the third bit signal to obtain a second check result; and perform level-(M+2) FEC decoding on the third bit signal based on the second check result to obtain a fifth bit signal.

In another example embodiment, when M+1 reaches the first preset threshold, the processor 701 is further configured to:

perform BL demapping processing on the third bit signal to obtain symbols corresponding to the third bit signal; and perform DM decoding on the symbols corresponding to the third bit signal to obtain the fourth bit signal.

The input/output device 703 is further configured to:

output the fourth bit signal.

It may be clearly understood by a person skilled in the art that, for the purpose of convenient and brief description, for a detailed working process of the foregoing system, apparatus, and unit, reference may be made to a corresponding process in the foregoing method embodiments, and details are not repeated herein.

In another example embodiment, when the decoding apparatus is a chip in a terminal, the chip includes a processing unit and a communications unit. The processing unit may be, for example, a processor. The communications unit may be, for example, an input/output interface, a pin, or a circuit. The processing unit may execute computer executable instructions stored in a storage unit, to enable the chip in the terminal to perform the decoding method according to the first aspect. Optionally, the storage unit is a storage unit in the chip, such as a register or a cache; or the storage unit may be a storage unit located outside the chip in the terminal, such as a read-only memory (ROM), another type of static storage device capable of storing static information and instructions, or a random access memory (RAM).

Any one of the above-mentioned processors may be a central processing unit (CPU), a microprocessor, an application-specific integrated circuit (ASIC), or one or more integrated circuits for controlling program execution of the decoding method according to the first aspect.

All or some of the foregoing embodiments may be implemented by using software, hardware, firmware, or any combination thereof. When software is used to implement the embodiments, the embodiments may be implemented completely or partially in a form of a computer program product.

The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a Solid State Disk (SSD)), or the like.

In the above embodiments described in present disclosure, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A decoding method, comprising:
   receiving, by a receive end device, a first bit signal;
   performing, by the receive end device, level-M forward error correction (FEC) decoding on the first bit signal to obtain a second bit signal, wherein M is a positive integer greater than zero;
   checking, by the receive end device, the second bit signal to obtain a first check result;
   performing, by the receive end device, level-(M+1) FEC decoding on the second bit signal based on the first check result to obtain a third bit signal; and
   upon determination that M+1 reaches a first threshold, performing, by the receive end device, data processing on the third bit signal to obtain a fourth bit signal, wherein the receive end device uses the fourth bit signal to obtain service data transmitted by a transmit end device,
   wherein the checking, by the receive end device, the second bit signal to obtain a first check result comprises:
   based upon determining whether a current count of each type of symbol in symbols corresponding to the second bit signal is equal to a preset count of that type of symbol, determining, by the receive end device, the first check result, wherein the first check result indicates whether the checking of the second bit signal is successful, and the current count of each type of symbol is a count of occurrences of the type of symbol in the symbols corresponding to the second bit signal.

2. The method according to claim 1, wherein the checking, by the receive end device, the second bit signal to obtain a first check result comprises:
   upon determination that the current count of each type of symbol in the symbols corresponding to the second bit signal is equal to the preset count of that type of symbol, determining, by the receive end device, the first check result, wherein the first check result indicates that the checking of the second bit signal is successful, and the preset count of each type of symbol is a preset count of occurrences of the type of symbol in symbols corresponding to the first bit signal, and
   the performing, by the receive end device, level-(M+1) FEC decoding on the second bit signal based on the first check result to obtain a third bit signal comprises:
   adjusting, by the receive end device, a log-likelihood ratio (LLR) value currently corresponding to the second bit signal to obtain a first LLR value, wherein an absolute value of the first LLR value is greater than an absolute value of the LLR value currently corresponding to the second bit signal; and
   performing, by the receive end device, level-(M+1) FEC decoding on the second bit signal based on the first LLR value to obtain the third bit signal.

3. The method according to claim 2, wherein the absolute value of the first LLR value is an absolute value of a preset maximum LLR value corresponding to the second bit signal or K times the absolute value of the LLR value currently corresponding to the second bit signal, wherein K is an integer greater than 1.

4. The method according to claim 1, wherein the checking, by the receive end device, the second bit signal to obtain a first check result comprises:
   upon determination that the current count of each type of symbol in the symbols corresponding to the second bit signal is not equal to the preset count of that type of symbol, determining, by the receive end device, the first check result, wherein the first check result indicates that the checking of the second bit signal fails, and the preset count of each type of symbol is a preset count of occurrences of the type of symbol in symbols corresponding to the first bit signal, and
   the performing, by the receive end device, level-(M+1) FEC decoding on the second bit signal based on the first check result to obtain a third bit signal comprises:
   adjusting, by the receive end device, a log-likelihood ratio (LLR) value currently corresponding to the second bit signal to obtain a second LLR value, wherein an absolute value of the second LLR value is less than an absolute value of the LLR value currently corresponding to the second bit signal; and
   performing, by the receive end device, level-(M+1) FEC decoding on the second bit signal based on the second LLR value to obtain the third bit signal.

5. The method according to claim 2, further comprising:
   after performing the level-M FEC decoding on the first bit signal to obtain the second bit signal, and before checking the second bit signal to obtain the first check result,
   determining, by the receive end device, the symbols corresponding to the second bit signal.

6. The method according to claim 5, wherein the determining, by the receive end device, the symbols corresponding to the second bit signal comprises:

performing, by the receive end device, binary labeling (BL) demapping processing on the second bit signal to obtain the symbols corresponding to the second bit signal.

7. The method according to claim 1, further comprising: after performing the level-M FEC decoding on the first bit signal to obtain the second bit signal, and before checking the second bit signal to obtain the first check result,
determining, by the receive end device, whether the LLR value currently corresponding to the second bit signal is greater than a second threshold; and
upon determination that the LLR value currently corresponding to the second bit signal is greater than the second threshold, triggering the checking of the second bit signal to obtain the first check result.

8. The method according to claim 1, further comprising: upon determination that M+1 does not reach the first threshold, checking, by the receive end device, the third bit signal to obtain a second check result, and performing, by the receive end device, level-(M+2) FEC decoding on the third bit signal based on the obtained second check result to obtain a fifth bit signal.

9. The method according to claim 1, wherein the performing, by the receive end device, data processing on the third bit signal to obtain a fourth bit signal comprises:
performing, by the receive end device, binary labeling (BL) demapping processing on the third bit signal to obtain symbols corresponding to the third bit signal; and
performing, by the receive end device, distribution matching (DM) decoding on the symbols corresponding to the third bit signal to obtain the fourth bit signal, and the method further comprises:
after performing the distribution matching (DM) decoding on the symbols corresponding to the third bit signal to obtain the fourth bit signal,
outputting, by the receive end device, the fourth bit signal.

10. A decoding apparatus, comprising:
a transceiver, configured to receive a first bit signal; and
at least one processor, configured to:
perform level-M forward error correction (FEC) decoding on the first bit signal to obtain a second bit signal, wherein M is a positive integer greater than zero;
check the second bit signal to obtain a first check result;
perform level-(M+1) FEC decoding on the second bit signal based on the first check result to obtain a third bit signal; and upon determination that M+1 reaches a first threshold, perform data processing on the third bit signal to obtain a fourth bit signal, wherein the fourth bit signal is used by a receive end device to obtain service data transmitted by a transmit end device,
wherein the checking of the second bit signal to obtain the first check result comprises:
based upon determining whether a current count of each type of symbol in symbols corresponding to the second bit signal is equal to a preset count of that type of symbol, determining the first check result, wherein the first check result indicates whether the checking of the second bit signal is successful, and the current count of each type of symbol is a count of occurrences of the type of symbol in the symbols corresponding to the second bit signal.

11. The decoding apparatus according to claim 10, wherein the at least one processor is further configured to:
upon determination that the current count of each type of symbol in the symbols corresponding to the second bit signal is equal to the preset count of that type of symbol, determine the first check result, wherein the first check result indicates that the checking of the second bit signal is successful, and the preset count of each type of symbol is a preset count of occurrences of the type of symbol in symbols corresponding to the first bit signal;
adjust a log-likelihood ratio (LLR) value currently corresponding to the second bit signal to obtain a first LLR value, wherein an absolute value of the first LLR value is greater than an absolute value of the LLR value currently corresponding to the second bit signal; and
perform level-(M+1) FEC decoding on the second bit signal based on the first LLR value to obtain the third bit signal.

12. The decoding apparatus according to claim 11, wherein the absolute value of the first LLR value is an absolute value of a preset maximum LLR value corresponding to the second bit signal or K times the absolute value of the LLR value currently corresponding to the second bit signal, wherein K is an integer greater than 1.

13. The decoding apparatus according to claim 10, wherein the at least one processor is further configured to:
upon determination that the current count of each type of symbol in the symbols corresponding to the second bit signal is not equal to the preset count of that type of symbol, determine the first check result, wherein the first check result indicates that the checking of the second bit signal fails, and the preset count of each type of symbol is a preset count of occurrences of the type of symbol in symbols corresponding to the first bit signal;
adjust a log-likelihood ratio (LLR) value currently corresponding to the second bit signal to obtain a second LLR value, wherein an absolute value of the second LLR value is less than an absolute value of the LLR value currently corresponding to the second bit signal; and
perform level-(M+1) FEC decoding on the second bit signal based on the second LLR value to obtain the third bit signal.

14. The decoding apparatus according to claim 11, wherein the at least one processor is further configured to:
determine the symbols corresponding to the second bit signal.

15. The decoding apparatus according to claim 14, wherein the at least one processor is further configured to:
perform binary labeling (BL) demapping processing on the second bit signal to obtain the symbols corresponding to the second bit signal.

16. The decoding apparatus according to claim 10, wherein the at least one processor is further configured to:
determine whether the LLR value currently corresponding to the second bit signal is greater than a second threshold; and
upon determination that the LLR value currently corresponding to the second bit signal is greater than the second threshold, trigger the checking of the second bit signal to obtain the first check result.

17. The decoding apparatus according to claim 10, wherein at least one processor is further configured to:
upon determination that M+1 does not reach the first threshold, check the third bit signal to obtain a second check result, and perform level-(M+2) FEC decoding on the third bit signal based on the obtained second check result to obtain a fifth bit signal.

18. The decoding apparatus according to claim 10, wherein the at least one processor is further configured to:

upon determination that M+1 reaches the first threshold, perform binary labeling (BL) demapping processing on the third bit signal to obtain symbols corresponding to the third bit signal, perform distribution matching (DM) decoding on the symbols corresponding to the third bit signal to obtain the fourth bit signal, and output the fourth bit signal via the transceiver.

19. A non-transitory, processor-readable medium comprising machine-readable instructions that, when executed by at least one processor, cause the at least one processor to:
receive a first bit signal;
perform level-M forward error correction (FEC) decoding on the first bit signal to obtain a second bit signal, wherein M is a positive integer greater than zero;
check the second bit signal to obtain a first check result;
perform level-(M+1) FEC decoding on the second bit signal based on the first check result to obtain a third bit signal; and upon determination that M+1 reaches a first threshold, perform data processing on the third bit signal to obtain a fourth bit signal, wherein the fourth bit signal is used by a receive end device to obtain service data transmitted by a transmit end device,
wherein the checking of the second bit signal to obtain the first check result comprises:
based upon determining whether a current count of each type of symbol in symbols corresponding to the second bit signal is equal to a preset count of that type of symbol, determining the first check result, wherein the first check result indicates whether the checking of the second bit signal is successful, and the current count of each type of symbol is a count of occurrences of the type of symbol in the symbols corresponding to the second bit signal.

* * * * *